United States Patent
Besser et al.

[11] Patent Number: 5,918,149
[45] Date of Patent: *Jun. 29, 1999

[54] DEPOSITION OF A CONDUCTOR IN A VIA HOLE OR TRENCH

[75] Inventors: Paul R. Besser, Cupertino; John A. Iacoponi, San Jose; Roger Alvis, Cupertino, all of Calif.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/602,415

[22] Filed: Feb. 16, 1996

[51] Int. Cl.⁶ .................................................. H01L 21/441
[52] U.S. Cl. .......................... 438/680; 438/656; 438/681; 438/653
[58] Field of Search ........................... 437/192, 190, 437/195, 200, 194, 203; 257/753, 757, 751, 764; 438/653, 656, 672, 680, 681, 685, 688

[56] References Cited

U.S. PATENT DOCUMENTS

| | | | |
|---|---|---|---|
| 4,673,623 | 6/1987 | Gardner et al. | 428/620 |
| 4,823,182 | 4/1989 | Okumura . | |
| 5,071,714 | 12/1991 | Rodbell et al. | 428/620 |
| 5,240,880 | 8/1993 | Hindman et al. | 437/190 |
| 5,246,881 | 9/1993 | Sandhu et al. | 437/192 |
| 5,290,731 | 3/1994 | Sugano et al. | 437/174 |
| 5,317,187 | 5/1994 | Hindman et al. . | |
| 5,360,995 | 11/1994 | Graas | 257/751 |
| 5,371,042 | 12/1994 | Ong | 437/194 |
| 5,380,678 | 1/1995 | Yu et al. | 437/190 |
| 5,385,867 | 1/1995 | Ueda et al. | 437/195 |
| 5,418,388 | 5/1995 | Okudaira et al. | 257/295 |
| 5,543,357 | 8/1996 | Yamada et al. | 437/192 |
| 5,627,102 | 5/1997 | Shrinki et al. . | |

FOREIGN PATENT DOCUMENTS

| | | |
|---|---|---|
| 0387835 A2 | 9/1990 | European Pat. Off. . |
| 0 525 637 A1 | 2/1993 | European Pat. Off. . |
| 0552968 A3 | 7/1993 | European Pat. Off. . |
| 0598422A1 | 5/1994 | European Pat. Off. . |
| 0716447 A2 | 6/1996 | European Pat. Off. . |
| 4120727 | 4/1992 | Japan . |

OTHER PUBLICATIONS

Wendt, H. et al., "Process Integration for Barrier Layers and Al–Alloys using a Sputtering Cluster Tool", *Microelectronic Engineering*, vol. 19 pp. 371–374, 1992.

Maheo, et al., "Microstructure and Electrical Resistivity of TiN Films Deposited on Heated and Negatively Biased Silicon Substrates", Thin Solid Films, vol. 237, No. 1/02, Jan. 1, 1994, pp. 78–86.

Hultman, et al., "Interfacial Reactions in Single–Crystal– TiN (100) /A1/ Polycrystalline–TiN Multilayer Thin Films", Thin Solid Films, vol. 215, No. 2, Aug. 14, 1992, pp. 152–161.

(List continued on next page.)

*Primary Examiner*—Caridad Everhart
*Attorney, Agent, or Firm*—Skjerven, Morrill, MacPherson, Franklin, & Friel, LLP; Edward C. Kwok; Philip W. Woo

[57] ABSTRACT

The present semiconductor device and method of fabrication thereof includes the provision of a trench or via hole in a dielectric, with a barrier layer thereon extending into the trench or via hole. A layer of titanium is provided over the barrier layer, also extending into the trench or via hole, and aluminum or aluminum alloy is provided over the titanium layer. The barrier layer provides good conformal coverage while also preventing outgassing of the dielectric from adversely affecting the conductor. The barrier layer also serves as a wetting agent for the deposition and flowing of aluminum or aluminum alloy. The titanium layer can be extremely thin, or non-existent, so as to avoid significant growth of TiAl₃ and the problems attendant thereto.

18 Claims, 3 Drawing Sheets

OTHER PUBLICATIONS

Joshi, et al., "Collimated Sputtering of TiN/Ti Liners into Sub–Half–Micrometer High Aspect Ratio Contacts/Lines", Applied Physics Letters, vol. 61, No. 21, Nov. 23, 1992, pp. 2613–2615.

Shih, et al., "Ti/Ti–N Hf/Hf–N and W/W–N Multilayer Films with High Mechanical Hardness", Applied Physics Letters, vol. 61, No. 6, Aug. 10; 1992, pp. 654–656.

Massiani, et al., "Effect of a Titanium Underlayer on the Corrosion Behaviour of Physically Vapour Deposited Titanium Nitride Films", Thin Solid Films, vol. 217, No. 1/02, Sep. 30, 1992, pp. 31–37.

Licata et al., "Dual Damascene Al Wiring For 256M Dram", VMIC Conference, 1995 ISMIC–104/95/0596, Jun. 27–29, 1995, pp. 596–602.

Eizenberg et al., "Chemical Vapor Deposited TiCN: A New Barrier Metallization For Submicron Via and Contact Applications", J. Vac. Sci. Technol. A 13 (3), May/Jun. 1995, pp. 590–595.

Sandhu et al., "Metalorganic Chemical Vapor Deposition of TiN Films For Advanced Metallization", Appl. Phys. Lett 62(3), Jan. 18,1993, pp. 240–242.

Hoshino et al., "Hyper(111)–Textured Al Interconnects By Reflowed Al on the CVD–TiN/cvd–Ti Film", VMIC Conference, 1995 ISMIC–104/95/0589, Jun. 27–29, 1995, pp. 589–593.

Inoue et al., "Behavior of TiN and Ti Barrier Metals In Al–Barrier–Al Via Hole Metallization", J. Electrochem. Soc., vol. 141, No. 4, Apr. 1994, pp. 1056–1061.

Ho et al., "Sputtered Metallurgy Process For Electromigration Improvement of Al–Cu Interconnections", IBM Technical Disclosure Bulletin, vol. 21, No. 11, Apr. 1979, pp. 4527–4528.

Gniewek et al., "Titanium Overlay on Metallurgy", IBM Technical Disclosure Bulletin, vol. 13, No. 5, Oct. 1970, p. 1124.

Brouillard, et al., "Thin Film Metallurgy With Sandwich Barrier Layer", IBM Technical Disclosure Bulletin, vol. 21, No. 2, Jul. 1978, p. 576.

Rodbell et al., "Texture Effects on the Electromigration Behavior of Layered Ti/AlCu/Ti Films", Mat. Res. Soc. Symp. Proc., vol. 265, 1992, pp. 107–113.

Shen et al., "A Highly Reliable Aluminum Metallization for Micron and Submicron VLSI Applications", V–MIC Conf., CH 2337–4/86/0000–0191, Jun. 9–10, 1986, pp. 191–197.

Inoue et al., "Effects of TiN/Ti Cap Layers on Improving Electromigration in Al Based Multi–Layered Interconnects", VMIC Conference, 1994 ISMIC–103/94/0275, Jun. 7–8, 1994, pp. 275–277.

Hewes et al., "Interaction of Titanium Cap and Aluminum Alloys With Tin Barrier Layer on Annealed Metal Sheet Resistance and on Electromigration", VMIC Conference, 1994 ISMIC—103/94/0278, Jun. 7–8, 1994, pp. 278–280.

Estabil et al., "Electromigration Improvements with Titanium Underlay and Overlay in Al (Cu) Metallurgy", VMIC Conference, TH–0359–0/91/0000–0242, Jun. 11–12, 1991, pp. 242–248.

Howard et al., "Intermetallic Compounds of Al and Transitions Metals: Effect of Electromigration In 1–2–υM–Wide Lines", J. Appl. Phys. 49(7), Jul. 1978, pp. 4083–4093.

Gardner et al., "Homogeneous and Layered Films of Aluminum/Silicon With Titanium for Multilevel Interconnects", V–MIC Conf., Jun . 25–26, 1985, pp. 102–113.

Tracy et al., "Texture in Multilayer Metallization Structures", J. Appl. Phys. 76(5), Sep. 1, 1994, pp. 2671–2680.

DEPOSITION OF A CONDUCTOR IN A VIA HOLE OR TRENCH

RELATED CASES

This case is related to U.S. patent application Ser. No. 08/347,781, filed Nov. 30, 1994, now abandoned entitled PROCESS FOR IN-SITU DEPOSITION OF A Ti/TiN BARRIER METAL STACK, invented by Besser et al., U.S. patent application Ser. No. 08/393,625, filed Feb. 24, 1995, now U.S. Pat. No. 5,738,917 entitled PROCESS FOR IN-SITU DEPOSITION OF A Ti/TiN/Ti ALUMINUM UNDERLAYER, invented by Besser et al.

FIELD OF THE INVENTION

This invention relates to semiconductor devices, and more particularly, to the deposition of a conductor in a via or trench.

BACKGROUND OF THE INVENTION

As semiconductor device geometries approach 0.25 $\mu$m feature size, increased attention has been directed to the difficulty in depositing aluminum or aluminum alloy into small vias holes or trenches. The use of multiple levels of interconnect metallization on a semiconductor device and shrinking feature size means that surface planarity, i.e., the flatness of the wafer surface, becomes increasingly important at critical operations in the processing of the device.

To improve surface planarity, various process steps and/or combinations of materials have been used. Years ago, it was standard practice on a multilevel metal structure to use sputtered aluminum or aluminum alloy in a trench or to form a via, i.e. an electrical connection between two levels of metal. This was done with the wafer surface between room temperature and 400° C.

The step coverage of the conductor deposited in this manner was found to be poor, leading to reliability problems due to the thinning of the conductor on the sides and bottom of the trench, or the sides of the via hole. This problem became progressively worse as additional layers were put down over an already non-planar surface.

An approach to solving this problem has been to use a separate material, such as tungsten, to form a via or plug. The excess tungsten on the surface of the wafer and not in the via hole or trench is etched or polished away, leaving a planar surface on top of which the next level of metal is deposited.

Another problem facing the semiconductor industry as the dimensions of interconnect lines continue to shrink is the etching of the conductor to form the patterned lines. The standard method in the integrated circuit industry involves depositing a blanket metal film, lithographically patterning the film, reactively ion etching to form lines, and encapsulating the lines with an oxide. Pitted sidewalls and residual polymer present reliability and contamination problems after the metal etch. These could be alleviated by a damascene approach to forming lines. The damascene approach differs from standard methods since the oxide is deposited, lithographically patterned, and etched to form trenches. Then the metal interconnect is deposited into these trenches. Excess metal is polished using special chemical-mechanical polish methods to leave lines of interconnect encapsulated on three sides with oxide. Damascene processing eliminates the need for metal etch and is expected to become standard practice in future technologies.

A need exists to fill trenches and via holes with sputtered aluminum or aluminum alloy. This has been accomplished thus far by increasing the temperature of the wafer during deposition of the conductor to between 450 to 600° C. At these temperatures (near the aluminum and aluminum alloy melting point), the conductor becomes softer, and can thus flow into small holes, completely filling them.

The mechanisms that lead to aluminum and aluminum alloy filling are not well understood. There are two general types of high-temperature processing: 1) reflow, and 2) hot Al. They are similar in that they both rely on temperatures between 400 to 600° C. The so-called reflow process is typically done by depositing the aluminum or aluminum alloy at a temperature between room temperature and 400° C. Afterward, the wafer is heated to between 500 to 600° C. The wafer is typically held at this temperature for several minutes, allowing the conductor to flow into the trench or via hole. The hot Al process is carried out in several steps. In the first step, a portion of the desired thickness of aluminum or aluminum alloy is deposited at relatively cold temperature (less than 400° C.), and then the wafer is heated up to between 500° C. to 600° C., and the remaining aluminum or aluminum alloy is deposited hot.

In either case, it is generally accepted that it is necessary to use a titanium wetting agent directly under the hot or reflowed conductor. It is very important that this titanium layer not be exposed to air before the conductor is deposited, as it will oxidize. In the absence of such titanium, the conductor will not flow or properly deposit in the bottom or on the sides of the trench or hole, leading to a void in the conductor.

At temperatures above 350° C., titanium and aluminum react, consuming a portion of the aluminum line up to three times the thickness of the original titanium underlayer. For example, if 500Å of titanium 20 is deposited under 5000Å of aluminum 22 (FIG. 1) in a recess 24 in a dielectric 26, and is fully reacted to form $TiAl_3$, a structure will result that is 2000Å thick $TiAl_3$ 28 under 3500Å aluminum 30. (See FIG. 2).

While it is generally accepted that the presence of titanium is needed for via hole or trench filling, the formation of $TiAl_3$ 28 causes some problems (see FIG. 3). First, the formation of $TiAl_3$, which has a lower electrical conductivity than aluminum or aluminum alloy 30, reduces the amount of current-carrying cross-section that is composed of the low resistivity aluminum and increases the electrical resistance of the metal interconnect lines. Second, $TiAl_3$ is difficult to chemically-mechanically polish: so it is desired to have this $TiAl_3$ layer as thin as possible or eliminate it altogether. Third, the reaction to form $TiAl_3$ during the hot deposition or reflow process may retard aluminum or alloy flow, and hence retard the filling process. This retardation arises from the $TiAl_3$ "spiking" through the grain boundaries in the aluminum or alloy by preferentially growing into the aluminum grains at the grain boundaries. Thermodynamically speaking, the formation of $TiAl_3$ at the grain boundaries requires less surface energy than growth of $TiAl_3$ into the bulk of the aluminum or alloy grain. The kinetics of $TiAl_3$ formation, however, provide a loophole or process window in which titanium can be used to provide the necessary wetting property. By depositing the aluminum or aluminum alloy cold initially, the rate of $TiAl_3$ formation is reduced, and an adequate, smooth seed layer of conductor is provided for subsequent deposition. Control of the titanium under layer thickness becomes critical. Too little, and there will not be enough of a wetting layer to enable the hole or trench filling. Too much, and the reaction forming $TiAl_3$ will impede the hole or trench filling. Normal variations in hole or trench size, depth and shape, titanium deposition rate and uniformity make precise control of the titanium thickness in and around the via hole or trench difficult, leading to yield and reliability problems.

Discontinuity of a sputtered, or PVD, titanium layer along a sidewall of a via or trench results in a poor physical barrier between the conductor and the interlayer dielectric oxide. Should the oxide outgas, the outgassing species may pass through the titanium layer when the wafer is heated for subsequent deposition steps. Hot aluminum or alloy is very sensitive to sputtering environment and surface conditions, and with any breach in the continuity of the titanium barrier/wetting layer, the outgassing species will negatively affect the fill of the aluminum or aluminum alloy.

SUMMARY OF THE INVENTION

The present invention provides a barrier layer in the form of titanium nitride, titanium oxynitride, titanium carbonitride, or titanium silicide in a recess in a dielectric. A thin titanium layer is provided over the dielectric, and aluminum or aluminum alloy conductor is provided in the recess over the titanium layer.

DESCRIPTION OF THE PREFERRED EMBODIMENTS

Reference is made to FIGS. 4(a)–7(a) for an understanding of a first embodiment of the present inventive method and device.

Figure 1:
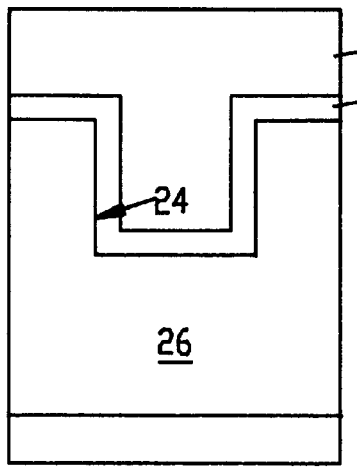
FIGS. 1–3 are cross-sectional views showing prior art semiconductor devices.
Figure 2:
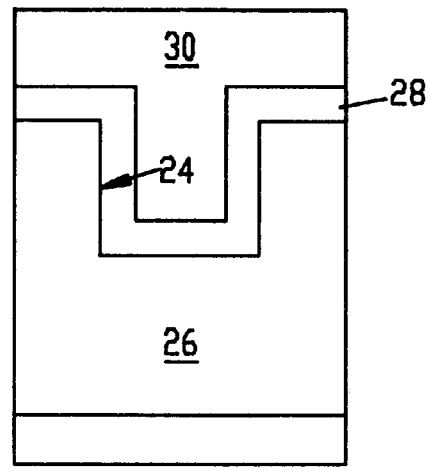
Figure 3:
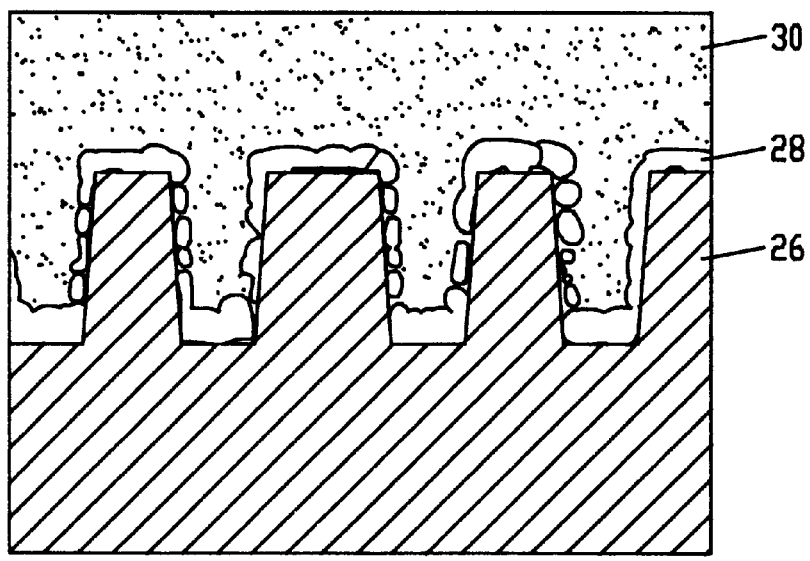
Figure 4A:
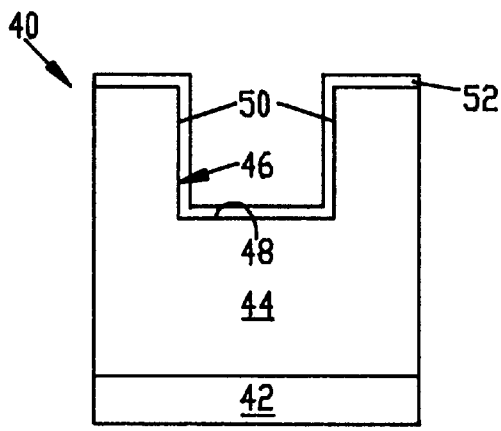
FIGS. 4–8 (including FIGS. 4(a)–4(b), 5(a)–5(b), 6(a)–(6b), 7(a)–7(b), and 8(a)–8(b) show cross-sections of semiconductor devices and methods of fabrication thereof in accordance with the present invention.
Figure 4B:
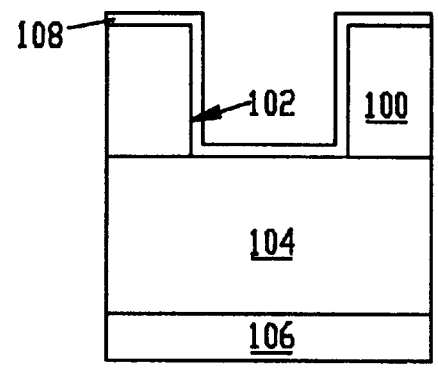
Figure 5A:
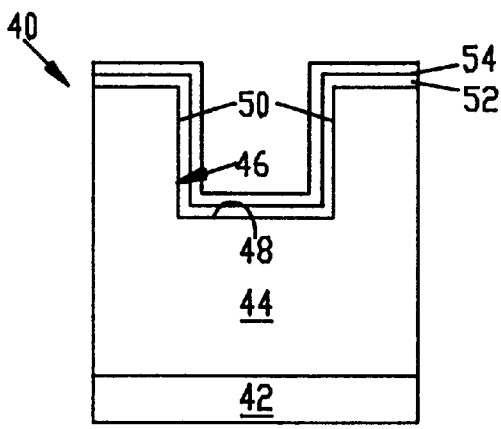
Figure 5B:
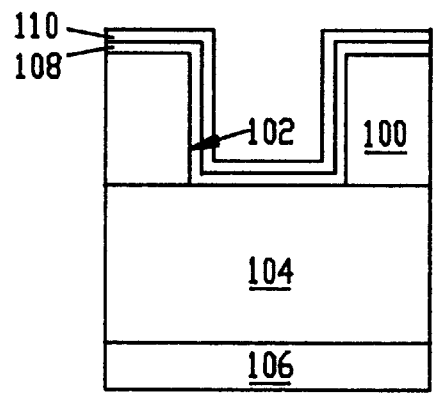

FIG. 4(a) shows a device 40 including a substrate 42 having a dielectric 44 in the form of an oxide formed thereover. The oxide has a recess 46 in the form of a trench etched therein, having a bottom 48 and sidewalls 50. A thin barrier layer 52, in the form of titanium nitride, titanium oxynitride, titanium carbonitride, or titanium silicide, is deposited using chemical vapor deposition (CVD). In the case of a titanium nitride layer 52, the titanium nitride source chemical, i.e. tetrakis dimethyl amino titanium [TDMAT, Ti[N(CH$_3$)$_2$]$_4$] is a liquid heated to approximately 45° C. A carrier gas, such as helium, is passed through a bubbler, where it mixes with the TDMAT vapor. The gas mixture is then introduced into a reaction chamber which is held at low pressure, typically in the range of 1 Torr. The TDMAT vapor, when in contact with the heated surface of the semiconductor wafer, decomposes into a titanium nitride film, in the recess 46 along the sides 50 and bottom 48 of the trench 46. The wafer surface is typically heated to between 300 to 500° C. The resulting film exhibits excellent coverage on the sides 50 and bottom 48 of the trench 46 that has been etched into the dielectric material 44.

The system used for the metal deposition is a commercially available Applied Materials Endura 5500 sputtering system with multiple processing chambers. The chambers are connected and maintained under a base vacuum level (<1E-6 Torr). The wafer is transferred from one chamber to another using a robot. The process for filling requires degas of the wafer at moderate temperatures on the Endura system, typically between 100 and 400° C. This is a standard process step for any metal deposition. After degassing, the CVD titanium nitride layer 52 is deposited in one chamber as described above, then the wafer is transferred to a chamber for titanium 54 deposition (FIG. 5(a)) in the trench 46, and then the wafer is moved to a chamber for aluminum or alloy 56 deposition (FIG. 6(a)) in the trench 46. The capping PVD titanium 54, which serves as an additional seed layer, could be deposited in a collimated chamber to ensure good step coverage. Any collimator aspect ratio could be used. Other techniques may also provide good step coverage. Examples include long throw sputtering and chemical vapor deposition. Titanium deposition conditions vary dramatically and the temperature can be from room temperature to 500° C. However, if the titanium deposition temperature is greater than a 100° C., the wafer should be cooled to less than a 100° C. prior to aluminum or aluminum alloy 56 deposition.

The Al was deposited using a three step deposition. The framework of the process for the Al deposition was suggested by Applied Materials. The initial layer (2000–4000 Å) of Al is deposited at high power (9000–15000W) and at room temperature to ensure conformal coverage by the Al of the trench. This serves as a seed layer for subsequent Al deposition. The wafer is then heated and the Al is deposited at low powers (1000–3000W, 3000–5000Å thick) such that the Al flows evenly into the trench. For increased throughput, the power is again increased (9000–15000W) in the final step to bring the total thickness to a predetermined value.

Following aluminum or aluminum alloy deposition into the trench or via, the wafer is cooled and returned to a wafer cassette. The aluminum or aluminum alloy 56 is then polished to result in the structure shown in FIG. 7(a).

The CVD titanium nitride 52 could with advantage be any CVD layer that has characteristics as follows: conformal coverage of the trench 46; good barrier characteristics that prevent outgassing of the dielectric 44 (in this case, oxide) from adversely affecting the conductor, and smooth and uniform deposition across the wafer. In effect, the titanium nitride 52 serves as a wetting layer for the deposition and flowing of aluminum or aluminum alloy on dielectrics.

Figure 8A:
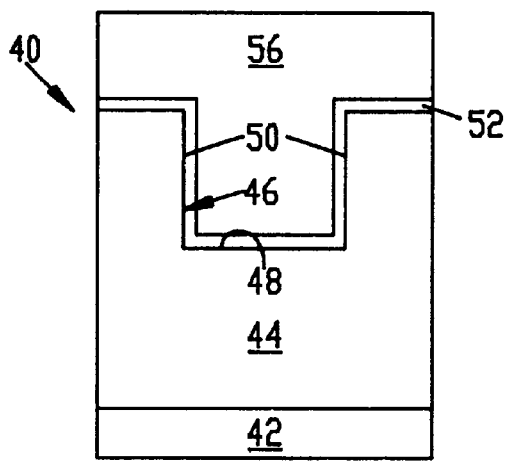

Several programs have been undertaken to establish the validity of the current process and device. When a CVD titanium nitride barrier layer 52 was used in conjunction with a titanium layer 54 of less than 200 Å thick, fill was complete. This also occurred with the titanium layer 54 less than 100 Å thick and also less than 50 Å thick. With a wafer temperature of 425° C. or greater, fill was complete with no titanium layer 54, and with a wafer temperature of 350° C., fill was substantially complete. (FIG. 8(a) is similar to FIG. 6(a) but shows aluminum or aluminum alloy 56 deposited directly on the barrier layer 52 with the barrier layer 52 and dielectric 44 at 425° C. or greater. Further process steps are then undertaken as described in regard to FIG. 7(a).) Thus, it has been demonstrated that trenches can be properly filled using a very thin or no titanium layer 54. This provides several distinct advantages: 1) thinner or no titanium results in less or no TiAl$_3$ formation and improves the current carrying cross-section of the conductor; 2) less or no TiAl$_3$ results in a structure that is easier to chemically-mechanically polish; and 3) with less or no TiAl$_3$, there will be little or no spiking of the grain boundaries, and with little or no spiking, there will not be current crowding effects.

FIGS. 4(b)–7(b) show a process flow like that in FIGS. 4(a)–7(a), but instead of a trench being defined by the dielectric 100, a via hole 102 is defined thereby to adjacent a lower level metal layer 104 on a substrate 106. The process flow is the same as that shown in FIGS. 4(a)–7(a); however, the bottom of the trench no longer exists but is replaced by the top surface of the lower level metal layer 104, and the hole 102 has, for example, a circular cross-section.

Similar to the previous described process and device, a barrier layer 108 of titanium nitride, titanium oxynitride, titanium carbonitride, or titanium silicide is deposited in the recess 102 defined by the dielectric 100. The process flow continues through deposition of a thin titanium layer 110 (FIG. 5(*b*)), and then an aluminum or aluminum alloy layer 112 (FIG. 6(*b*)) which is later polished to result in the structure shown in FIG. 7*d*.

Thus a portion of the barrier layer 108 is in the recess 102, a portion of titanium layer 110 is in the recess 102 over the barrier layer 108, and a portion of the aluminum or aluminum alloy layer 112 in the recess over the titanium layer 110.

Figure 6A:
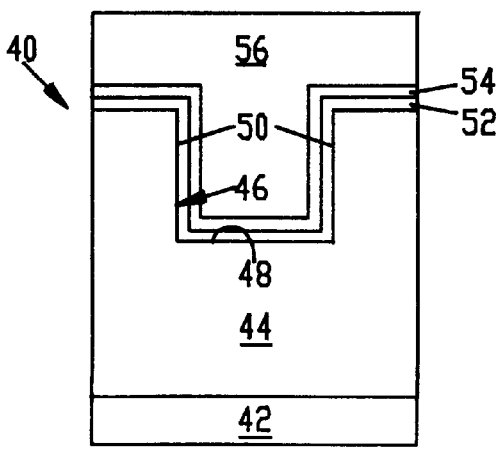
Figure 6B:
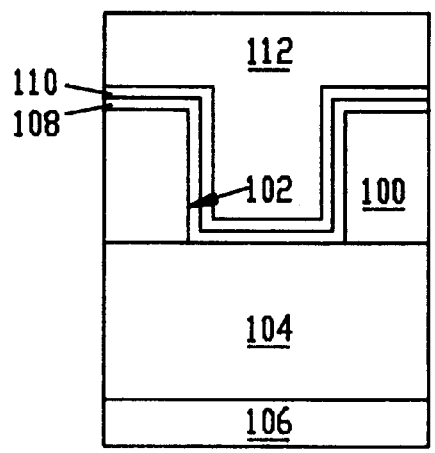
Figure 7A:
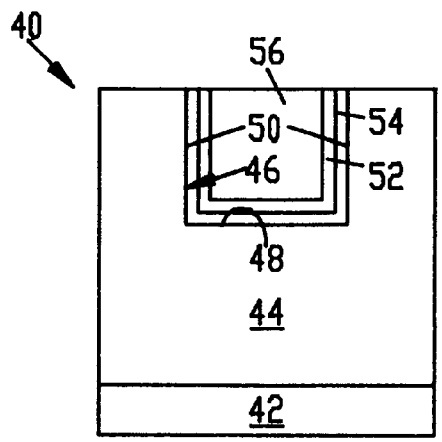
Figure 7B:
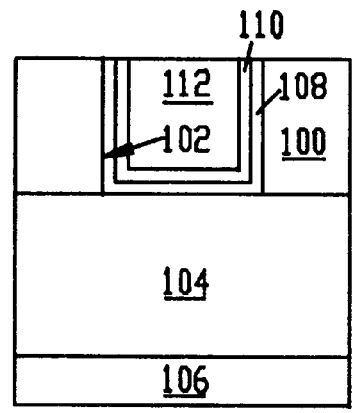
Figure 8B:
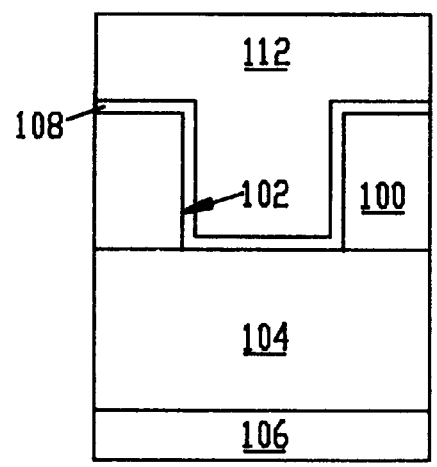

FIG. 8(*b*) is a view similar to FIG. 6(*b*) but again, a via hole 102 is defined by the dielectric 100 to a lower metal layer 104 on a substrate 106.

It will be seen that the entire process flow is the same as that as described above in relation to a trench defined by the dielectric layer, and thus all of the discussion above, along with the advantages achieved, are attendant hereto.

For multilevel metal structures additional steps may or may not be included to ensure good electrical conductivity. These may include incorporation of a surface treatment and additional metallic layers (i.e., Ti) underneath the TIN barrier layer.

What is claimed is:

1. A method of fabricating a semiconductor structure on a wafer, the method comprising:

providing an oxide dielectric on the wafer, said dielectric having a recess therein;

heating a surface of said wafer;

depositing a barrier layer of titanium nitride in said recess by a chemical vapor deposition process in which a titanium nitride source material is decomposed into titanium nitride by said heated surface of said wafer;

depositing a titanium layer in said recess over said barrier layer, said titanium layer deposited by a physical vapor deposition process to a thickness of less than 200 Å;

depositing an aluminum seed layer at room temperature in said recess over said titanium layer, wherein said seed layer is between 2000 and 4000Å thick;

heating said wafer to 425° C. or less; and depositing a second aluminum layer over said seed layer.

2. The method of claim 1 and further providing the barrier layer comprises carbon.

3. The method of claim 1 and further providing that the titanium layer is less than 100Å thick.

4. The method of claim 1 and further providing that the titanium layer is less then 50Å thick.

5. A method of fabricating a semiconductor structure on a semiconductor wafer, the method comprising:

providing a dielectric having a recess therein;

heating a surface of said semiconductor wafer;

depositing a barrier layer including titanium and nitrogen in said recess using a chemical vapor deposition process in which a source material is decomposed into a titanium and nitrogen containing material by said heated surface of said semiconductor wafer;

holding said dielectric and barrier layer at a temperature of 425° C. or greater; and providing a conductor in said recess over said barrier layer.

6. The method of claim 5 and further providing the barrier layer is titanium nitride.

7. The method of claim 5 and further providing the barrier layer comprises carbon.

8. A method of fabricating a semiconductor structure on a semiconductor wafer, the method comprising:

providing a dielectric having a recess therein;

heating a surface of said semiconductor wafer;

depositing a barrier layer including titanium and nitrogen in said recess using a chemical vapor deposition process in which a source material is decomposed into a titanium and nitrogen containing material by said heated surface of said semiconductor wafer;

holding said dielectric and barrier layer at a temperature of 350° C. or greater; and providing a conductor in said recess over said barrier layer.

9. A method of fabricating a semiconductor structure on a wafer, the method comprising:

providing an oxide dielectric having a recess therein;

heating a surface of said wafer;

depositing a barrier layer of titanium nitride in said recess by a chemical vapor deposition process in which a titanium nitride source material is decomposed into titanium nitride by said heated surface of said wafer; and depositing an aluminum layer in said recess over said barrier layer.

10. The method of claim 9, wherein said aluminum layer comprises a seed layer and a second aluminum layer over said seed layer.

11. The method of claim 10, wherein said seed layer is between 2000 and 4000 Å thick.

12. The method of claim 10, wherein said seed layer is deposited at a temperature of less than approximately 100° C.

13. The method of claim 10, wherein said wafer is maintained at less than 425° C. while depositing said second aluminum layer.

14. The method of claim 13, wherein said wafer is maintained at approximately 350° C. while depositing said second aluminum layer.

15. The method of claim 9, further comprising depositing a titanium layer in said recess over said barrier layer.

16. The method of claim 15, further comprising cooling said wafer to below 100° C. prior to depositing said aluminum layer.

17. The method of claim 9, wherein said chemical vapor deposition comprises passing a carrier gas through tetrakis dimethyl amino titanium liquid.

18. The method of claim 1, wherein said chemical vapor deposition comprises passing a carrier gas through tetrakis dimethyl amino titanium liquid.

* * * * *